United States Patent
Honma et al.

(10) Patent No.: US 6,235,121 B1
(45) Date of Patent: May 22, 2001

(54) VERTICAL THERMAL TREATMENT APPARATUS

(75) Inventors: Manabu Honma, Shiroyama-Machi; Tomohisa Shimazu, Sagamihara, both of (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/489,608

(22) Filed: Jan. 21, 2000

(30) Foreign Application Priority Data

Jan. 26, 1999 (JP) ................................ 11-017360

(51) Int. Cl.[7] .................................................. C23C 16/00
(52) U.S. Cl. .................... 118/730; 118/715; 118/724; 118/725; 118/729; 118/733; 432/241; 432/250; 432/253
(58) Field of Search .................... 118/724, 725, 118/729, 730, 715, 733; 432/241, 250, 253

(56) References Cited

U.S. PATENT DOCUMENTS

| 4,989,540 | * | 2/1991 | Fuse et al. ............................ 118/719 |
| 5,016,567 | * | 5/1991 | Iwabuchi et al. ..................... 118/733 |
| 5,127,365 | * | 7/1992 | Koyama et al. ...................... 118/724 |
| 5,324,540 | * | 6/1994 | Terada ................................ 427/255.5 |
| 5,370,371 | * | 12/1994 | Miyagi et al. ....................... 266/256 |
| 5,421,892 | * | 6/1995 | Miyagi et al. ....................... 118/724 |
| 5,540,782 | * | 7/1996 | Miyagi et al. ....................... 118/724 |
| 6,030,457 | * | 2/2000 | Shimazu et al. ..................... 118/715 |

FOREIGN PATENT DOCUMENTS 6-168904 * 6/1994 (JP).
10-321532 12/1998 (JP).

* cited by examiner

Primary Examiner—Jeffrie R. Lund
(74) Attorney, Agent, or Firm—Smith, Gambrell & Russell, LLP

(57) ABSTRACT

In a vertical thermal treatment apparatus wherein a plurality of semiconductor wafers are held in multiple layers within a wafer boat, the wafer boat is mounted onto a turntable at the upper end of a rotational shaft that penetrates from a bottom portion through a shaft hole into a vertical reaction vessel, and the wafers are subjected to a thermal treatment while the wafer boat is rotated; a seal is formed between the rotational shaft and the penetration portion, to restrain the intrusion of gases and moisture into the seal portions from the interior of the reaction vessel and to eliminate adverse effects on the seal materials. The space within a gap between a shaft hole 33 and a rotational shaft 4 communicates with a space between a fixing member 34 and an outer shell member 44, and a magnetic seal portion 7 is provided between this fixing member 34 and the outer shell member 44. This increases the effective length of the shaft hole 33 from the reaction vessel to the magnetic seal portion 7, preventing the intrusion of gases and moisture into the magnetic seal portion 7 from the reaction vessel during reduced-pressure CVD and also alleviating the effects of heat from the reaction vessel which is heated to a high temperature by a heating furnace 21, thus preventing deterioration of the magnetic fluid.

11 Claims, 4 Drawing Sheets

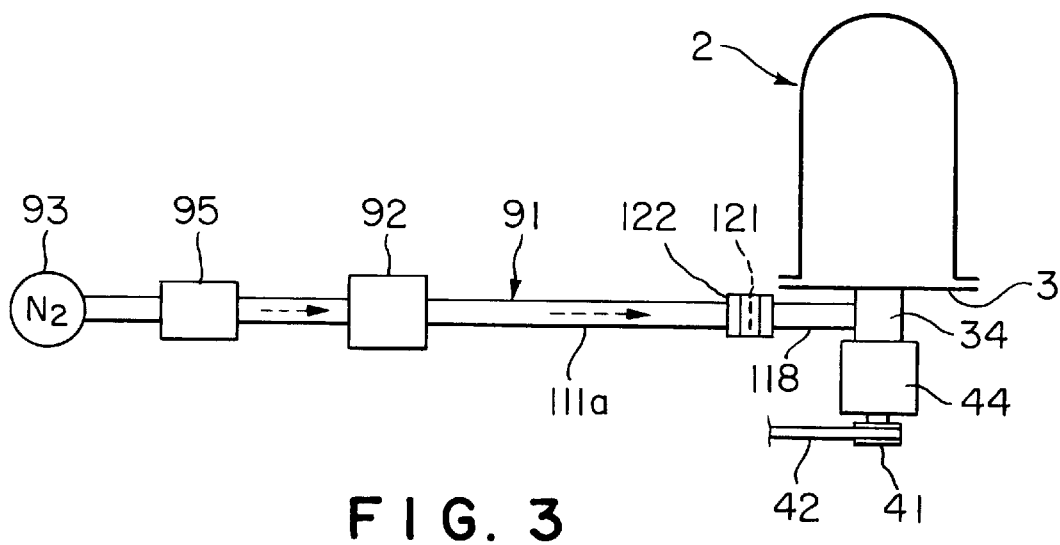
F I G. 3
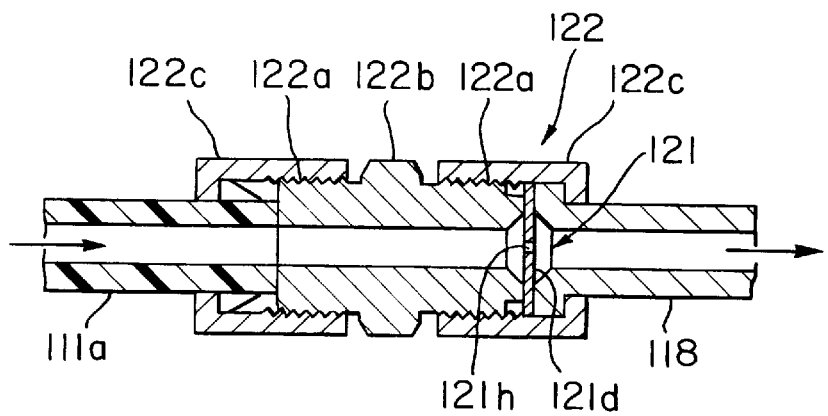
F I G. 4
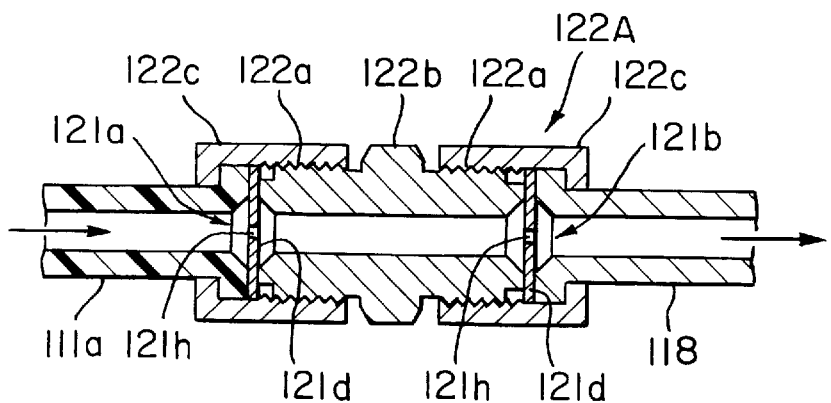
F I G. 5

VERTICAL THERMAL TREATMENT APPARATUS

BACKGROUND OF THE INVENTION

1. Technical Field

The present invention relates to a vertical thermal treatment apparatus of a type wherein a vertical rotational shaft passes through a shaft hole and penetrates into a reaction vessel that is designed for performing a thermal treatment on a substrate to be processed, using processing gases under vacuum environment.

2. Description of Related Art

A vertical thermal treatment apparatus is known in the art as an apparatus for subjecting a batch of semiconductor wafers (hereinafter called "wafers") to a thermal treatment, and such a vertical thermal treatment apparatus is used for procedures such as the film-formation processing called reduced-pressure CVD, oxidation, and the diffusion of impurities. In each of these apparatuses, the configuration is such that a wafer boat holding wafers in multiple layers is conveyed into a vertical reaction vessel, usually from below, and a lower aperture of the reaction vessel is closed hermetically by a lid member that supports the wafer boat.

In this type of apparatus, the wafer boat is made to rotate about a vertical shaft in order to improve the uniformity of the thermal treatment within each wafer surface, and in such a case the configuration is such that the vertical rotational shaft penetrates the lid member and the wafer boat is supported on that rotational shaft.

As shown in FIG. 6, a shaft support device is used for introducing a rotational shaft through a lid member and into the reaction vessel of a reduced-pressure CVD furnace. FIG. 6 shows a state in which a lower aperture of a manifold 11, which is provided in a lower portion of a double-walled reaction tube 10, is closed by a lid member 12. A vertical rotational shaft 13 penetrates within a metal cylindrical casing 14 that is provided on a lower side of the lid member 12, with a turntable 15 attached to the upper end thereof and a pulley 16 driven by a motor (not shown in the figure) attached to the lower end thereof. A shaft bearing 17 is provided between the cylindrical casing 14 and the rotational shaft 13, with a magnetic seal means 18 provided thereabove to form a hermetic seal between the reaction vessel (which is configured of the reaction tube 10 and the manifold 11 in this case) and the exterior.

The magnetic seal means 18 consists of a support member 18a, which surrounds the rotational shaft 13, and a magnetic fluid 18b, with the magnetic fluid 18b providing a hermetic seal between the exterior and the interior space on the side of the reaction vessel of the cylindrical casing 14. The support member 18a is configured of a plurality of magnetic path members that are U-shaped in vertical section and are arrayed in the vertical direction, and the magnetic fluid 18b provides a magnetic seal between the edge portion of each of the magnetic path members and the rotational shaft 13.

If the film-formation gases should intrude into the shaft support device during the film-formation processing with the above described prior-art configuration, the film-formation gases will come into contact with cooled portions where reaction by-products will be generated, and these will adhere to the support member 18a of the magnetic seal means 18, which will slow the rotation.

The inventors have studied the use of a common furnace for CVD and for oxidation and diffusion but the prior-art configuration raises a problem when used in common in this manner in that moisture penetrates into the shaft support device during wet oxidation and that moisture causes deterioration in the magnetic fluid 18b of the magnetic seal means 18.

In that case, it could be considered to use a configuration wherein there is no through-hole in the lid member 12 and a shaft on the inner side of the lid member 12 and a shaft on the outer side thereof are linked by magnetic coupling, instead of providing the rotational shaft 13 that passes through the lid member 12, but in this case solid members of synthetic resin are used as lubrication members in a magnetic coupling structure, which means that the load resisting characteristics thereof are poor and there is a danger of vibration in the shafts at high loads. In addition, ceramic bearings are used in a magnetic coupling structure, but such bearings expand at high temperatures and cause rubbing between adjacent bearings and there is a danger that the rubbing thereof will generate particles, so a small gap is provided in order to prevent this generation of particles, but this leads to rattling at normal temperatures.

The present invention was devised in the light of the above circumstances and the object thereof is to provide a vertical thermal treatment apparatus wherein a rotational shaft penetrates into a reaction vessel in which a film is formed under a vacuum environment, and, wherein the intrusion of gases and moisture into a shaft seal portion from the interior of the reaction vessel is restrained and adverse effects on seal materials are prevented.

SUMMARY OF THE INVENTION

According to the present invention, there is provided a vertical thermal treatment apparatus comprising a vertical reaction vessel, a lid member for closing a bottom portion of the reaction vessel, a rotational shaft penetrating in a vertical direction upwards from below through the lid member and into the reaction vessel, a turntable provided on the rotational shaft within the reaction vessel and supporting a support member for a substrate to be processed, and a rotational drive mechanism for driving the rotational shaft in rotation to rotate the support member for a substrate to be processed, wherein the thermal treatment apparatus further comprises: a substantially cylindrical fixing member fixed to the lid member and having a shaft hole through which the rotational shaft passes; a bottomed cylindrical outer shell member having a side wall portion surrounding the fixing member, with a space opened up between the side wall portion and the fixing member, and a bottom portion fixed hermetically to an outer peripheral surface of the rotational shaft below a lower end of the fixing member, for enabling communication between a gap between the shaft hole and the rotational shaft and a space on an outer side of the fixing member; a shaft bearing provided between the fixing member and the side wall portion, at an upper position within the opened-up space between the side wall portion and the fixing member; and a seal portion provided between the fixing member and the side wall portion to form a seal between an outer wall surface of the fixing member and an inner wall surface of the side wall portion, at a lower position in the opened-up space between the side wall portion and the fixing member.

The seal portion may be a magnetic seal portion in which a magnetic fluid is used as a sealing member. A purge gas supply path may be connected to the fixing member at a position closer to the reaction vessel than the seal portion, for supplying a purge gas into the gap between the shaft hole and the rotational shaft. The configuration could be such that an annular groove is provided in an upper surface of the bottom portion of the outer shell member and an annular protruding portion is provided in a lower end of the fixing member to engage the annular groove.

The purge gas supply path is connected to an inert gas supply source and is provided with means for maintaining a pressure within the purge gas supply path to be greater than atmospheric pressure. It would be advantageous if the purge gas supply path were configured of flexible synthetic resin piping. The means for maintaining a pressure within the purge gas supply path to be greater than atmospheric pressure may be provided with a gas pressurization device within the purge gas supply path and throttle means within the purge gas supply path at a position closer to the fixing member than the gas pressurization device. It would be advantageous if the throttle means were incorporated within a pipe joint provided in the purge gas supply path.

BRIEF DESCRIPTION OF THE DRAWINGS

FIG. 3 is illustrative of a purge gas supply path in the apparatus of FIG. 2;

FIG. 4 is an enlarged sectional view of a piping joint shown in FIG. 3;

FIG. 5 is an enlarged sectional view of a modification of the piping joint of FIG. 4.

DESCRIPTION OF THE PREFERRED EMBODIMENTS

Figure 1:
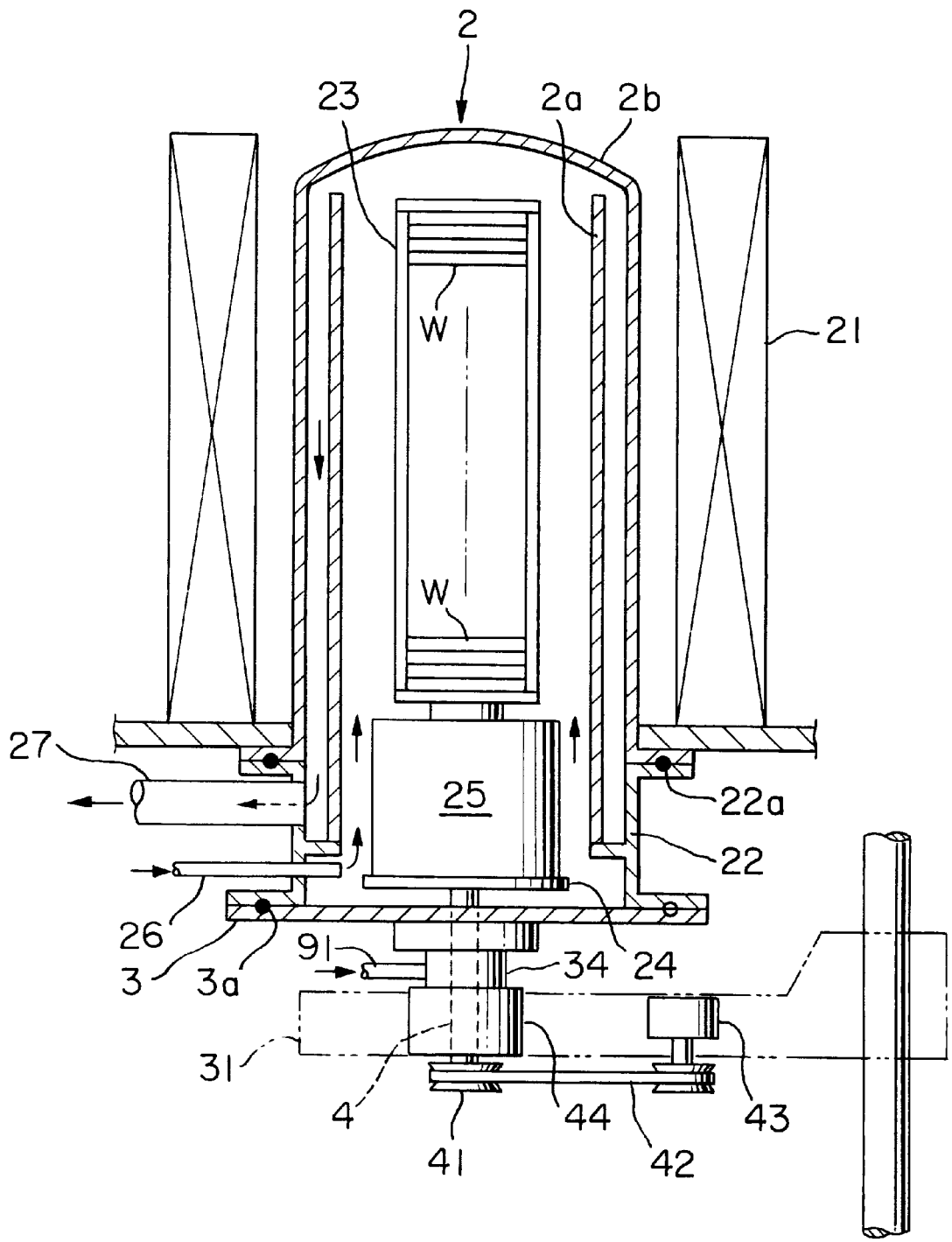
FIG. 1 is a vertical sectional view through the entire configuration of a vertical thermal treatment apparatus in accordance with an embodiment of this invention.

The overall configuration of a vertical thermal treatment apparatus in accordance with an embodiment of this invention is shown in FIG. 1. In this figure, reference numeral 2 denotes a reaction tube of a double-walled structure consisting of an inner tube 2a and an outer tube 2b, made of quartz, with a heating furnace 21 provided around the periphery of the reaction tube 2. A cylindrical manifold 22 made of metal is provided so as to be hermetically joined with a lower side of the reaction tube 2, with an O-ring 22a therebetween. A wafer boat 23 holding a large number of wafers W in multiple stages is conveyed inward from a lower aperture of the manifold 22 and this aperture is closed by a lid member 3. A sealing portion between the lid member 3 and the manifold 22 is maintained in a hermetic state by an O-ring 3a.

The lid member 3 is provided on top of a boat elevator 31, which is an elevator mechanism, and a rotational shaft 4 is provided so as to penetrate vertically through a central portion of the lid member 3. A pulley 41 is attached to the lower end of the rotational shaft 4, with the configuration being such that this pulley 41 is rotated by a motor 43 via a belt 42. A turntable 24 is attached to the upper end of the rotational shaft 4, and the wafer boat 23 is mounted on top of this turntable 24 with a thermal insulating tube 25 therebetween.

A gas supply pipe 26 for supplying a film-formation gas into the inner tube 2a and an exhaust pipe 27 for evacuating the space between the inner tube 2a and the outer tube 2b are each connected to the manifold 22. In this example, a reaction vessel is configured of the reaction tube 2 and the manifold 22.

Figure 2:
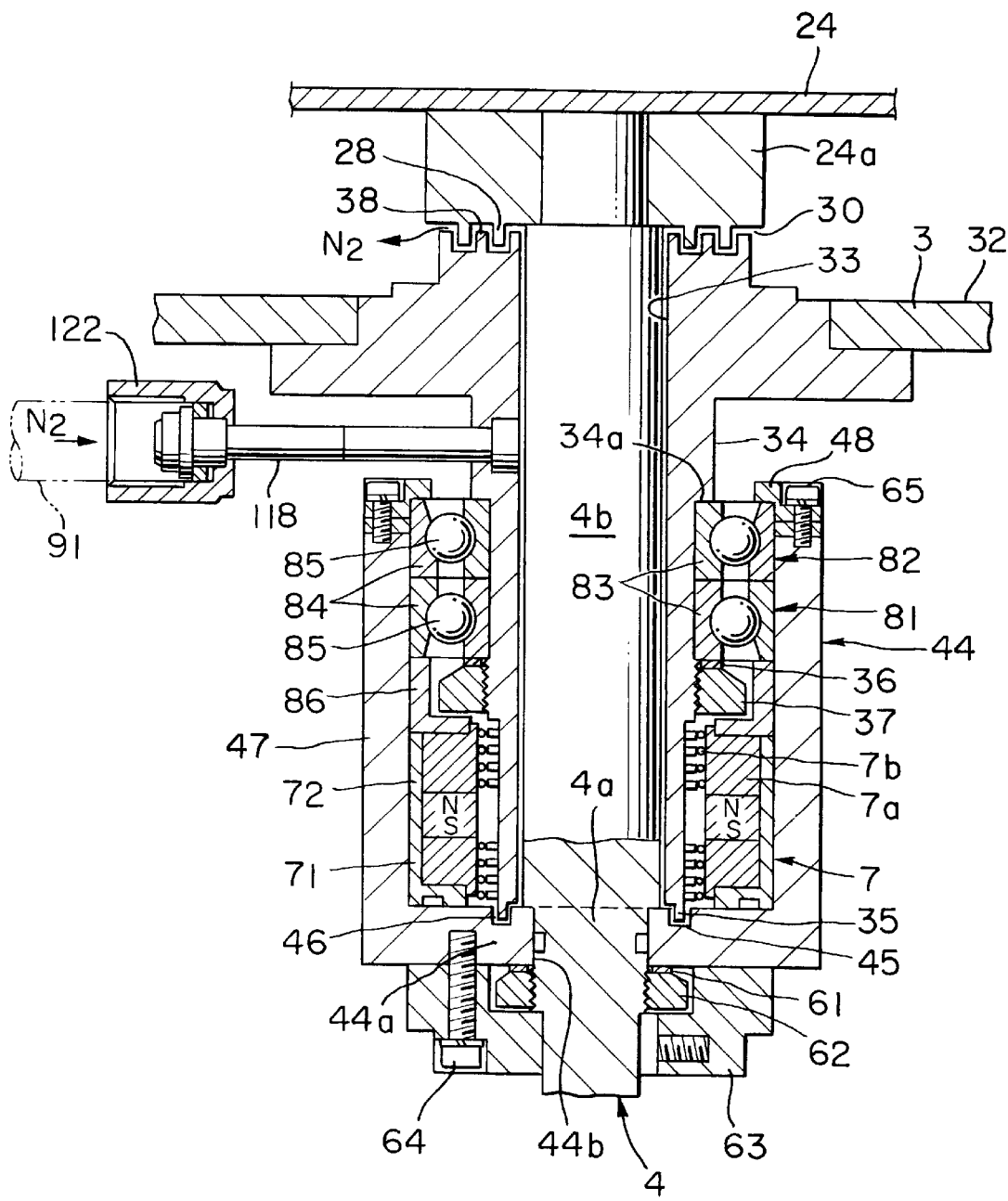
FIG. 2 is an enlarged view of a penetration portion of a rotational shaft in the vertical thermal treatment apparatus of FIG. 1.
Figure 6:
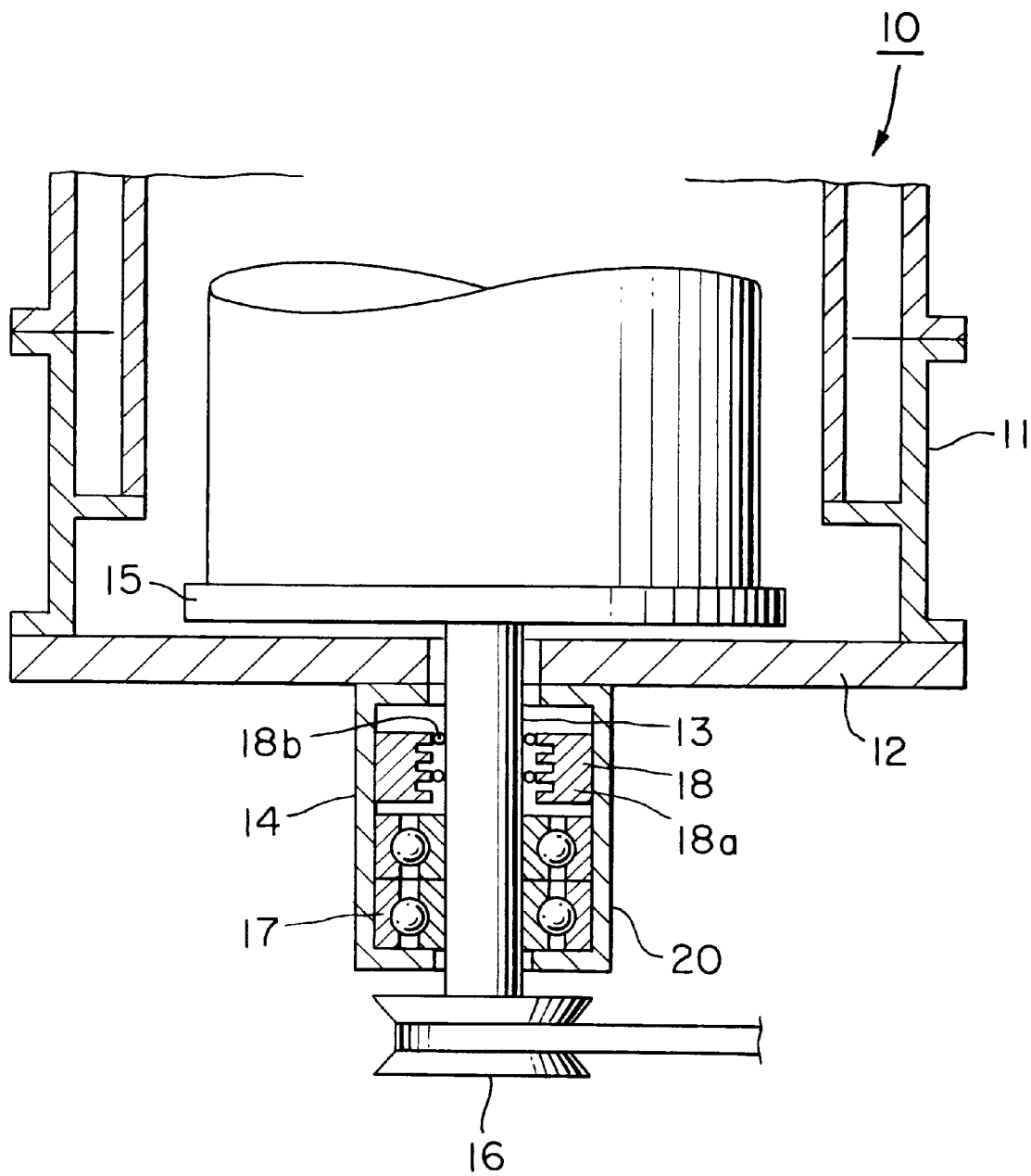
FIG. 6 is a vertical sectional view through a penetration portion of the rotational shaft of a vertical thermal treatment apparatus of the prior art.

The description now turns to a penetration portion of the rotational shaft 4, with reference to FIG. 2.

The lid member 3 is configured, in a hermetically integrated manner, of a horizontal member 32, which extends perpendicularly to the axial direction of the rotational shaft 4 and closes off the lower aperture of the manifold 22, and an approximately cylindrical fixing member 34 having a vertical shaft hole 33 through which the rotational shaft 4 penetrates. The upper end of this fixing member 34 is provided with an annular protrusion 38 that has a saw-tooth section and protrudes into the reaction vessel. This annular protrusion 38 engages with an annular protruding portion 28 that has a saw-tooth section and is formed on the lower surface of a base end portion 24a of the turntable 24, with a gap therebetween, to form a labyrinth 30 which configures a gas flow passageway. This labyrinth 30 communicates with a gap created between the shaft hole 33 and the rotational shaft 4.

To the rotational shaft 4 is hermetically fixed an outer shell member 44 of a bottomed cylindrical shape that surrounds the outer periphery of the fixing member 34. Thus the outer shell member 44 rotates together with the rotational shaft 4. The outer shell member 44 has a through-hole 44b in the center of a bottom base 44a thereof. The outer shell member 44 is sandwiched between and fixed by a stepped portion, which is formed between a larger-diameter portion 4b and a smaller-diameter portion 4a of the rotational shaft 4, and a nut 62 by fitting from below the through-hole 44b around the smaller-diameter portion 4a of the rotational shaft 4, and then screwing the nut 62 thereonto from below, with a washer 61 therebetween. A cap 63 accommodates the nut 62 and is fixed by a bolt 64 to the lower surface of the bottom base 44a of the outer shell member 44.

An annular groove 45 is formed in the upper surface of the bottom base of the outer shell member 44 around the through-hole 44b, the lower end of the cylindrical fixing member 34 is formed into a reduced portion 35 that protrudes in an annular form in a thickness that is approximately half that of the main portion of the fixing member 34 and protrudes further downward to be inserted into the groove 45 in the bottom base of the outer shell member 44, with a gap therebetween, thereby forming a gas flowpath 46. This gas flowpath 46 communicates with a gap created between the shaft hole 33 and the rotational shaft 4.

A magnetic seal portion 7 is provided on the side of the bottom base of the fixing member 34 and shaft bearings 81 and 82 are provided on the side of the aperture of the manifold 22, between a side wall portion 47 of the outer shell member 44 and the cylindrical fixing member 34. The magnetic seal portion 7 creates a seal such that any processing gas that flows from the gap created between the shaft hole 33 and the rotational shaft 4 beyond the gas flowpath 46 between the lower end of the fixing member 34 and the bottom base of the outer shell member 44 does not leak out into the side of the shaft bearings 81 and 82.

The magnetic seal portion 7 is configured in a similar manner to the prior art, in that a magnetic fluid 7b is interposed between a magnetic path member 7a and a fixing member 34, and magnetic paths are formed by the magnetic path member 7a and the magnetic fluid 7b, to support the magnetic fluid. Reference numeral 71 in the figure denotes a cylindrical spacer for supporting a magnetic seal 72, which is provided extending from the bottom base of the outer shell member 44 and along the side wall portion 47.

Each of the shaft bearings 81 and 82 comprises balls 85 interposed between an annular inner-ring member 83 fixed to the fixing member 34 and an annular outer-ring member 84 fixed to the inner surface of the outer shell member 44. The inner-ring members 83, the outer-ring members 84, and the balls 85 are all formed from high-carbon chromium bearing steel.

The inner-ring members 83 are fitted from below onto the outside of a reduced portion of the fixing member 34, then these are tightened from below by a nut 37 with a washer 36 therebetween so as to be fixed between a stepped portion 34a adjacent a thicker portion of the fixing member 34 and the nut 37.

The outer-ring members 84 are sandwiched between an annular pressing member 48 and a spacer 86 for holding the bearings, which is superimposed above the spacer 71 for holding the magnetic seal along the inner surface of the outer shell member 44. The pressing member 48 is fixed by a bolt 65 to the upper end of the outer shell member 44.

A gas supply path 91 for supplying a purge gas into the shaft hole 33 is connected thereto at a heightwise position between the pressing member 48 and the horizontal member 32 of the lid member 3, and this gas supply path 91 is connected to a supply source (not shown in FIG. 2) of an inert gas such as nitrogen.

To restrain any increase in temperature of the magnetic seal portion 7, the height from the magnetic seal portion 7 to the lower surface of the lid member 3 is made to be roughly 100 mm, byway of example, to distance the magnetic seal portion 7 from the reaction vessel. A pipe may be used as the rotational shaft 4, making it difficult for heat to be transferred from the reaction vessel.

The operation of the above described embodiment of this invention will now be described. First of all, a wafer boat 23 holding a stack of a large number of wafers W, which are the substrates to be processed, is conveyed into the reaction vessel from the lower aperture of the reaction vessel (the lower aperture of the manifold 22) by raising the boat elevator 31, and the lower aperture is closed hermetically by the lid member 3. Vacuum evacuation is performed from the exhaust pipe 27 through the space between the inner tube 2a and the outer tube 2b, while a film-formation gas is supplied from the gas supply pipe 26 into the inner tube 2a, to maintain the interior of the reaction vessel to a degree of vacuum on the order of $10^{-7}$ Torr, by way of example, and a thermal treatment atmosphere at a predetermined temperature is created by the heating furnace 21.

The wafer boat 23 is rotated by causing the rotational shaft 4 to rotate by the motor 43 and a gas such as nitrogen is supplied into the shaft hole 33 from the gas supply path 91. If the portions cooled by the introduction of the processing gas into the shaft hole 33, in other words, the inner walls of the shaft hole 33, the rotational shaft 4, and the magnetic seal portion 7 were to come into contact with the magnetic fluid, by-products would be created thereat. However, the by-products can be blown out by blowing nitrogen into the shaft hole 33. In particular, since nitrogen is blown into the shaft hole 33 from the side of the reaction vessel rather than the magnetic seal portion 7, and this nitrogen flows into the reaction vessel through the labyrinth 30, the by-products can be prevented from adhering to the magnetic fluid, whereby any slowing of the rotation of the rotational shaft 4 is prevented.

Examples of the film-formation processing that can be cited include the formation of a polysilicon film by $SiH_4$ gas or the formation of silicon nitride ($Si_3N_4$) by $SiH_2Cl_2$ and $N_3$ gases. The blowing in of nitrogen is particularly effective in the latter case, in which large quantities of ammonium chloride are generated as a by-product. Note that when the present invention is applied to reduced-pressure CVD, the shaft hole 33 could be held at a vacuum, with no gases being blown therein.

The supply of a purge gas into the shaft hole 33 is also effective during the cleaning operation by gases such as HCl from the interior of the reaction vessel after reduced-pressure CVD, and can prevent the intrusion of the HCl into the shaft hole 33.

In accordance with the above described embodiment of the invention, the gap between the shaft hole 33 and the rotational shaft 4 communicates with the space between the fixing member 34 and the outer shell member 44, and the magnetic seal portion 7 is provided between the fixing member 34 and the outer shell member 44. In other words, the configuration is such that the gap between the rotational shaft 4 and the fixing member 34 extends downward from the base portion of the reaction vessel and extends upwards after being bent outward. Thus, the length of the shaft hole 33 from the reaction vessel to the magnetic seal portion 7 is large and has an intermediate bent portion, making it possible to prevent the intrusion of the gases and moisture produced during reduced-pressure CVD, from the interior of the reaction vessel into the magnetic seal portion 7. It is also possible to prevent deterioration of the magnetic fluid because of the reduction in the effects of heat from the reaction vessel, which is heated to a high temperature by the heating furnace 21. Since the shaft hole 33 is connected to an outwardly bent portion, the length in the upward direction of the rotational shaft 4 can be restrained to be small even though the length of the gas passage including the shaft hole 33 is increased, so that there is no need to increase the height of the space at the lower side of the reaction vessel (the space through which the boat elevator 31 rises and falls).

In this case, it is preferable that positions close to the reaction vessel in the shaft hole 33 are kept at a temperature such that reaction by-products do not adhere, because gases can easily enter. In the above described example, the temperatures at positions up to the lower end of the shaft hole 33 at the rotational shaft 4 are maintained at over 100° C. by the heat from the reaction vessel side. These temperatures increase nearer the reaction vessel, but they slightly exceed 150° C. in the vicinity of the center of the shaft hole 33. If the temperature of the shaft hole 33 in the vicinity of the reaction vessel is held at over 150° C. in this manner, it is possible to restrain the adhesion of reaction by-products, such as the above described ammonium chloride, to the outer peripheral surface of the rotational shaft 4 and the periphery of the shaft hole 33 (the inner peripheral surface of the fixing member 34).

The invention as described above can also be applied to an atmospheric-pressure oxidation and diffusion furnace for performing oxidation or the diffusion of impurities at atmospheric pressure, while corrosive gases such as HCl and $H_2O$ vapor are supplied into the reaction vessel.

Details of the purge gas supply path 91 connected to the fixing member 34 of the rotational shaft penetration portion are shown in FIG. 3. This purge gas supply path 91 is connected to a supply source 93 for an inert gas such as nitrogen, by a flowrate control device 92.

It is preferable that a plastic pipeline 111a, which is flexible, durable, heat-resistant, and corrosion-resistant, is used as piping that is connected to a gas introduction connection pipe 118 of the purge gas supply path 91 of the rotational shaft penetration portion. It is preferable that tubing made of a fluorocarbon resin, such as a perfluoroalkoxy polymer (PFA), is used as this plastic pipeline 111a.

A pipe joint 122 having an orifice 121 that acts as a throttle means is provided downstream of the plastic pipeline 111a, and the gas introduction connection pipe 118 and the plastic pipeline 111a are connected together by this pipe joint 122. The configuration is such that an inert gas such as nitrogen ($N_2$) at a pressure greater than atmospheric pressure (1013 hPa), such as at 1064 hPa (800 Torr) or greater, is supplied from the supply source 93 through the flowrate control device 92 into the plastic pipeline 111a. In other words, to prevent atmospheric components from permeating through the wall of the plastic pipeline 111a into the plastic pipeline, the inert gas within the plastic pipeline 111a is pressurized to a pressure greater than atmospheric pressure by a gas pressurization device 95.

Since the interior of the reaction tube 2 is held as a reduced pressure such as 33 Pa (0.25 Torr), the previously mentioned orifice 121 is provided downstream of the plastic pipeline 111a in the connection portion between the plastic pipeline 111a and the gas introduction connection pipe 118, in the example shown in this figure, to create a pressure difference between the side of the plastic pipeline 111a and the side of the gas introduction connection pipe 118 and thus reduce the pressure of the gas to substantially the same as in the reaction tube 2. The inert gas from the gas supply source 93 is set to a predetermined flowrate, such as 0.01 liters/minute (5 to 10 sccm), by the flowrate control device 92.

The orifice 121 is preferably provided in the interior of the pipe joint 122, as shown in FIG. 4. A union joint or the like is preferably used as the pipe joint 122. The pipe joint 122 shown in these figures is configured of a union joint connecting together the plastic pipeline 111a and the gas introduction connection pipe 118 which is made of stainless steel. This union joint (pipe joint) 122 is mainly configured of a main union body 122b having male threaded portions 122a at each end thereof, and union nuts 122c screwed in a removable manner onto the two ends of the main union body 122b.

The gas introduction connection pipe 118 is connected by one of the union nuts 122c onto one end of the main union body 122b, with the orifice 121 therebetween, and the plastic pipeline 111a is connected by the other of the union nuts 122c onto the other end of the main union body 122b. The orifice 121 is configured of an orifice plate that is, for example, a circular plate 121d of stainless steel with a small-diameter (such as 4 μm) hole 121h provided in the center thereof.

The plastic pipeline 111a differs from the flexible pipe of stainless steel that is used conventionally in that it is designed to be difficult to crack due to the repeated stresses imposed thereon by the opening and closing of the lid member 3, and is more durable, and it also makes it possible to prevent the permeation of atmospheric components from the pipe walls of the plastic pipeline 111a by making the pressure of the inert gas greater than atmospheric pressure, thus preventing contamination of the substrates to be processed, such as semiconductor wafers, by the intrusion of atmospheric components. In addition, since the orifice 121 is provided within the pipe joint 122, it is possible to provide the orifice 121 easily within the purge gas supply path 91.

FIG. 4 illustrates an example in which one orifice is provided, but a plurality of orifices could also be provided in order to increase the pressure difference. A configuration in which two orifices are provided in the pipe joint is shown in FIG. 5. In this pipe joint, such as a union joint 122A, the plastic pipeline 111a is connected to one end of the main union body 122b by a union nut 122c, with a first orifice 121a therebetween, and the gas introduction connection pipe 118 is connected to the other end of the main union body 122b by another union nut 122c, with a second orifice 121b therebetween.

The invention as described above makes it possible to restrain the intrusion of gases and moisture from the reaction vessel into the seal portions when it comes to sealing the penetration portions of the rotational shaft in the vertical thermal treatment apparatus, thus restraining adverse effects on the sealing members. In addition, stress fractures and the like in the purge gas supply path can be prevented, the penetration of atmospheric components into the purge gas supply path can be prevented, and contamination of the objects to be treated can be prevented, by ensuring that the main components of the purge gas supply path are plastic piping, a throttle portion is provided downstream thereof, and gas pressure within the plastic piping is made to be greater than atmospheric pressure.

What is claimed is:

1. A vertical thermal treatment apparatus comprising a vertical reaction vessel, a lid member for closing a bottom portion of said reaction vessel, a rotational shaft penetrating in a vertical direction upwards from below through said lid member and into said reaction vessel, a turntable provided on said rotational shaft within said reaction vessel and supporting a support member for a substrate to be processed, and a rotational drive mechanism for driving said rotational shaft in rotation to rotate said support member for a substrate to be processed, said thermal treatment apparatus further comprising:

a substantially cylindrical fixing member fixed to said lid member and having a shaft hole through which said rotational shaft passes;

a bottomed cylindrical outer shell member having a side wall portion surrounding said fixing member, with a space opened up between the side wall portion and the fixing member, and a bottom portion fixed hermetically to an outer peripheral surface of said rotational shaft below a lower end of said fixing member, for enabling communication between a gap between said shaft hole and said rotational shaft and a space on an outer side of said fixing member;

a shaft bearing provided between said fixing member and said side wall portion, at an upper position within said opened-up space between said side wall portion and said fixing member; and a seal portion provided between said fixing member and said side wall portion to form a seal between an outer wall surface of said fixing member and an inner wall surface of said side wall portion, at a lower position in said opened-up space between said side wall portion and said fixing member.

2. The vertical thermal treatment apparatus as defined in claim 1, wherein said seal portion is a magnetic sealing member using a magnetic fluid as a seal material.

3. The vertical thermal treatment apparatus as defined in claim 1, further comprising:

a purge gas supply path connected to said fixing member at a position closer to said reaction vessel than said seal portion, for supplying a purge gas into said gap between said shaft hole and said rotational shaft.

4. The vertical thermal treatment apparatus as defined in claim 1, further comprising:

an annular groove provided in an upper surface of the bottom portion of said outer shell member, and an annular protruding portion provided in a lower end of said fixing member and engaging said groove.

5. The vertical thermal treatment apparatus as defined in claim 1, wherein the bottom portion of said outer shell member engages with a stepped portion formed by a reduced diameter portion provided in said rotational shaft, and a nut is screwed and tightened onto said rotational shaft on the opposite side of said bottom portion of said outer shell member from said stepped portion, in such a manner that said bottom portion of the outer shell member is pressed against said stepped portion.

6. The vertical thermal treatment apparatus as defined in claim 1, wherein a labyrinth portion is provided between a lower surface of said turntable and an upper surface of said fixing member.

7. The vertical thermal treatment apparatus as defined in claim 1, wherein said purge gas supply path is connected to an inert gas supply source and is provided with means for maintaining a pressure within said purge gas supply path to be greater than atmospheric pressure.

8. The vertical thermal treatment apparatus as defined in claim 1, wherein said purge gas supply path is made of a flexible synthetic resin piping.

9. The vertical thermal treatment apparatus as defined in claim 8, wherein means for maintaining a pressure within said purge gas supply path to be greater than atmospheric pressure is provided with a gas pressurization device within said purge gas supply path and throttle means within said purge gas supply path at a position closer to said fixing member than said gas pressurization device.

10. The vertical thermal treatment apparatus as defined in claim 9, wherein said means for maintaining a pressure within said purge gas supply path to be greater than atmospheric pressure includes flowrate control means.

11. The vertical thermal treatment apparatus as defined in claim 9, wherein said throttle means is incorporated within a pipe joint provided in said purge gas supply path.

* * * * *